US009787046B2

(12) United States Patent
Lu et al.

(10) Patent No.: US 9,787,046 B2
(45) Date of Patent: Oct. 10, 2017

(54) WIRE SORTING FIXTURE AND METHOD OF SORTING WIRES

(71) Applicants: Tyco Electronics Corporation, Berwyn, PA (US); Shenzhen AMI Technology Co., Ltd., Shenzhen (CN)

(72) Inventors: Roberto Francisco-Yi Lu, Bellevue, WA (US); Qinglong Zeng, Shenzhen (CN); Charles David Fry, New Bloomfield, PA (US); Bicheng Chen, Harrisburg, PA (US)

(73) Assignees: TE CONNECTIVITY CORPORATION, Berwyn, PA (US); SHENZHEN AMI TECHNOLOGY CO., Shenzhen (CN)

( * ) Notice: Subject to any disclaimer, the term of this patent is extended or adjusted under 35 U.S.C. 154(b) by 281 days.

(21) Appl. No.: 13/834,439

(22) Filed: Mar. 15, 2013

(65) Prior Publication Data

US 2014/0109385 A1 Apr. 24, 2014

Related U.S. Application Data

(60) Provisional application No. 61/716,682, filed on Oct. 22, 2012.

(51) Int. Cl.
*H05K 1/00* (2006.01)
*H01R 43/28* (2006.01)
(Continued)

(52) U.S. Cl.
CPC ......... *H01R 43/28* (2013.01); *H01R 43/0263* (2013.01); *H01R 4/027* (2013.01); *Y10T 29/49998* (2015.01)

(58) Field of Classification Search
CPC ........ H01R 43/28; H01R 9/032; H01R 11/11; H01R 4/02; H01R 4/22; H01B 11/12;
(Continued)

(56) References Cited

U.S. PATENT DOCUMENTS 3,668,301 A * 6/1972 Faulconer ................ H01R 4/10 174/135
4,117,585 A * 10/1978 Smith .................... H01R 43/01 140/140
(Continued)

FOREIGN PATENT DOCUMENTS

CN 202014019 U 10/2011
EP 1009074 A2 * 6/2000 ............ H01R 43/01
(Continued)

OTHER PUBLICATIONS

EP 1009074A2.*
(Continued)

*Primary Examiner* — Pete Lee

(57) ABSTRACT

A wire sorting fixture includes a cable support configured to support a multi-wire cable and a wire support configured to support wires of the cable. The wire support has a top surface. The wire support has cradles open at the top surface. The wire support has separating walls between corresponding cradles. A top plate is positioned above the wire support. The top plate is moved toward the wire support to a clamping position after the wires are positioned in the corresponding cradles. The top plate holds the wires between the top plate and the wire support in the clamping position.

9 Claims, 6 Drawing Sheets

(51) Int. Cl.
*H01R 43/02* (2006.01)
*H01R 4/02* (2006.01)

(58) Field of Classification Search
CPC ...... H01B 11/06; H01B 11/08; H01B 7/0045; H01B 7/08; H01B 7/00; H01B 7/18; H01B 7/0807; H01B 7/0823; H01B 7/083; H01B 7/0838; H01B 7/0846; H01B 7/0853; H01B 7/0861; H01B 7/0869; H01B 7/0876; H01B 7/0884; H01B 7/0892; H01B 3/085; H01B 3/008; H01B 3/08; H01B 3/081; H01B 3/082; H01B 3/00; H01B 3/30; H01B 3/305; H01B 3/306; H01B 3/308; H01B 3/32; H01B 3/42; H01B 3/421; H01B 3/422; H01B 3/423; H01B 3/425; H05K 9/0018; H01H 9/02; H02G 3/0431; H02G 3/08; H02G 3/10; H02G 15/043; B60R 16/0207; G02B 6/4498
USPC .................... 174/117 F, 74 R; 29/566.3, 828
See application file for complete search history.

(56) References Cited

U.S. PATENT DOCUMENTS

| | | | | | |
|---|---|---|---|---|---|
| 4,476,628 | A * | 10/1984 | Kees, Jr. | 29/861 | |
| 4,974,311 | A | 12/1990 | Tran | | |
| 5,005,611 | A * | 4/1991 | Hecker | H01R 43/28 | 140/147 |
| 5,023,992 | A * | 6/1991 | Masaki | H01R 43/01 | 29/593 |
| 5,655,284 | A * | 8/1997 | Ferrill et al. | 29/566.3 | |
| 6,227,502 | B1 * | 5/2001 | Derman | F16L 3/2235 | 248/68.1 |
| 6,370,769 | B1 * | 4/2002 | Lilienthal, II | H01R 43/01 | 29/748 |
| 8,424,198 | B2 * | 4/2013 | McCaskey | 29/755 | |
| 2002/0084093 | A1 | 7/2002 | Zhang et al. | | |
| 2008/0236889 | A1 * | 10/2008 | Ishida et al. | 174/74 R | |

FOREIGN PATENT DOCUMENTS

| | | | |
|---|---|---|---|
| EP | 1 355 389 | A2 | 10/2003 |
| TW | 493308 | B | 7/2002 |

OTHER PUBLICATIONS

International Search Report, International Application No. PCT/US2013/066108, International Filing Date, Oct. 22, 2013.

First Office Action for Chinese Application No. 201380055003.9, issued Jul. 5, 2016.

* cited by examiner

WIRE SORTING FIXTURE AND METHOD OF SORTING WIRES

CROSS REFERENCE TO RELATED APPLICATIONS

This application claims the benefit of U.S. Provisional Application No. 61/716,682 filed Oct. 22, 2012, the subject matter of which is herein incorporated by reference in its entirety.

BACKGROUND OF THE INVENTION

The subject matter herein relates generally to wire sorting methods and fixtures.

Many electrical components are mounted to ends of cables. The cables have individual wires that are terminated to the various components of the electrical component. For example, the wires may be soldered to circuit boards or terminated to contacts or terminals. Assembly of the electrical components and connection of the electrical components to the cables is time consuming. Typically, the wires are sorted manually from the bundle of wires exiting the cable, such as by an operator manually manipulating each wire individually, and placing the wire in position for terminating to the circuit board or contacts. Such manual sorting of the wires is time consuming. Additionally, the wires may not be straightened and are not fixed in position for termination, the termination process is typically performed manually by the operator. Such manual termination process is time consuming.

There is a need for a cost effective process of sorting wires of a cable.

BRIEF DESCRIPTION OF THE INVENTION

In one embodiment, a wire sorting fixture is provided having a cable support configured to support a multi-wire cable and a wire support configured to support wires of the cable. The wire support has a top surface. The wire support has cradles open at the top surface. The wire support has separating walls between corresponding cradles. A top plate is positioned above the wire support. The top plate is moved toward the wire support to a clamping position after the wires are positioned in the corresponding cradles. The top plate holds the wires between the top plate and the wire support in the clamping position.

In another embodiment, a method of sorting wires of a multi-wire cable is provided including positioning the cable in a wire sorting fixture having a cable support and a wire support having individual cradles configured to receive different wires of the cable. The method includes coarse positioning of the wires in the cradles by generally aligning the wires with openings of the cradles and fine positioning of the wires in the cradles by pressing downward on the wires using a top plate. The cradles guide the wires to a predetermined location.

DETAILED DESCRIPTION OF THE INVENTION

Figure 1:
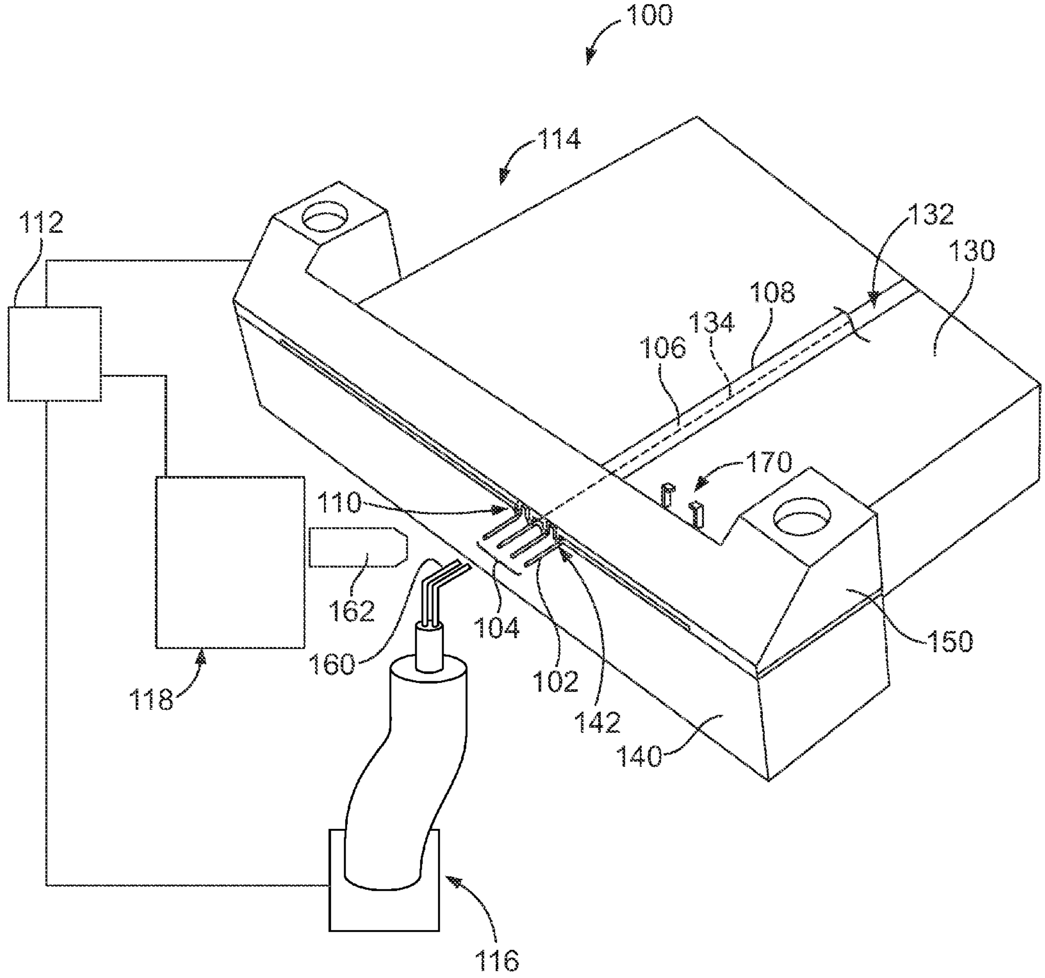
FIG. 1 illustrates a wire sorting machine formed in accordance with an exemplary embodiment.

FIG. 1 illustrates a wire sorting machine 100 formed in accordance with an exemplary embodiment. The wire sorting machine 100 is used to position individual wires 102 from a wire bundle 104 of a cable 106 for processing and/or termination. In an exemplary embodiment, the wire sorting machine 100 is used to automatically separate the wires 102 as part of an automated process without human intervention. Alternatively, components of the wire sorting machine 100 may be used to aid in a manual wire sorting process, while providing advantages that make the manual wire sorting process more efficient than conventional processes. The wire sorting machine 100 is used to hold the wires 102 during transfer to another machine or station, such as for further processing. For example, the wire sorting machine 100 may hold the wires 102 during stripping, cutting, coating, soldering and/or crimping of the wires 102.

The wire bundle 104 is exposed by removing a portion of a jacket 108 of the cable 106. The wire bundle 104 is presented at a wire sorting area 110 of the wire sorting machine 100. The wires 102 may be individually separated from the other wires 102 and may be positioned at a predetermined location relative to the other wires 102 for further processing, such as for stripping and/or terminating the wires 102 to an electrical component, such as a circuit board.

In an exemplary embodiment, the wire sorting machine 100 includes a controller 112, a wire sorting fixture 114, a wire gripper 116 and a sensor module 118. The wire sorting fixture 114 holds the cable 106 and the wire bundle 104 at the wire sorting area 110. The wire gripper 116 grips individual wires 102 and moves the wire 102 to a predetermined location. The sensor module 118 senses the locations of the wires 102 and may identify the particular wire 102, such as to control operation of the wire gripper 116. The controller 112 is coupled to the wire sorting fixture 114, the wire gripper 116 and the sensor module 118 to control operation thereof and/or to receive feedback therefrom.

The wire sorting fixture 114 includes a cable support 130 used to hold the cable 106. In an exemplary embodiment, the cable support 130 includes an elongated channel 132. The cable 106 is set in the channel 132. The cable support 130 may fix the cable on the cable support 130, such as by using clamps or fingers that hold the cable 106 proximate to the end of the jacket 108 near the wire bundle 104. In an exemplary embodiment, the cable support 130 holds the cable 106 such that the wires 102 and wire bundle 104 extend along a cable axis 134. In the illustrated embodiment, the cable 106 is oriented generally horizontally. Other orientations are possible in alternative embodiments. Optionally, the cable support 130 may include multiple channels 132, such as for holding multiple cables 106 using the same fixture 114. Optionally, the channels 132 may have different sizes for receiving different size cables 106.

The wire sorting fixture 114 includes a wire support 140 used to hold the wires 102 extending from the cable 106. In an exemplary embodiment, the wire support 140 includes a plurality of individual cradles 142 that support the individual wires 102. Optionally, more than one wire 102 may be held in the same cradle 142. For example, multiple drain or ground wires may be held in the same cradle 142. The wires 102 are set in the cradles 142 by the wire gripper 116. Optionally, the wire support 140 may include multiple sets of cradles 142, such as for receiving wires 102 from multiple cables or for receiving different gauge wires 102 or for positioning the wires 102 at different relative locations. For example, in one area, the cradles 142 may be at a first pitch or spacing and in another area the cradles 142 may be at a different pitch or spacing. Optionally, the wire support 140 may have cradles 142 on both sides (e.g. the top and the bottom) of the wire support 140 for supporting wires 102 on both sides of the wire support 140.

The wire sorting fixture 114 includes a top plate 150 above the wire support 140. The top plate 150 is used to clamp the wires 102 in the cradles 142. The top plate 150 is movable relative to the wire support 140 to press the wires 102 in the cradles 142 and hold the wires 102 in position, such as for processing or termination. The top plate 150 may extend into the cradles 142. Optionally, the wire sorting fixture 114 may include a bottom plate similar to the top plate but arranged below the wire support 140. The bottom plate may operate similar to the top plate 150, such as for holding wires 102 in cradles 142 on the bottom of the wire support 140.

The wire gripper 116 may include clamps or fingers 160 that are used to grasp the separated wire 102. The wire gripper 116 moves the wire 102 to one of the cradles 142. The operation of the wire gripper 116 is controlled by the controller 112. The wire gripper 116 may be movable in three dimensions to move the wire 102 to a desired location. The wire gripper 116 may allow translational movement, angular movement and rotational movement of the fingers 160. The wire gripper 116 may be controlled by a robotic motion system, such as a Cartesian motion robot with a rotary axis, a selective compliance assembly robot arm (SCARA) or other robotic motion system.

The sensor module 118 includes a sensor 162 used to locate the wires 102. The sensor 162 is positioned proximate to the wire sorting area 110. The sensor 162 may be positioned proximate to the wire support 140 to sense the positions of the wires 102. Optionally, the sensor 162 may be part of, or coupled to, the wire gripper 116. The sensor 162 may be used to identify particular wires 102. For example, the senor 162 may identify characteristic of the wires 102, such as the layout, shape, positional data, color and the like, to identify the wires 102. Optionally, the sensor 162 may include a camera to identify characteristics of the wires 102.

In an exemplary embodiment, the sensor 162 is coupled to the controller 112. Data from the sensor 162 is transmitted into the controller 112, and processed by the controller 112 to control operation of the other components, such as the top plate 150 of the wire sorting fixture 114 or the wire gripper 116. For example, the sensor 162 may determine a position of a particular wire 102 and the controller 112 may operate the wire gripper 116 to grasp the wire 102 and move the wire to a particular cradle 142. Other wires 102 are manipulated in a similar fashion to position each of the wires 102 in predetermined locations. The top plate 150 may be operated after each of the wires 102 are positioned in the cradles 142 to clamp the wires 102 in place for further processing, such as to terminate the wires 102 to a circuit board.

In an alternative embodiment, rather than using an automated wire gripper 116 and/or sensor module 118, the wires 102 may be sorted manually by hand and positioned in the wire sorting fixture 114. The wire sorting fixture 114 may increase productivity by reducing assembly time, such as by finely positioning the wires 102 once the wires 102 are coarsely positioned by hand within the wire support 140. The wire sorting fixture 114 may additionally be used to hold the wires 102 in proper position for further processing, which may be accomplished by an automated process or manually, but without the need for further positioning by the operator.

In an exemplary embodiment, the wire sorting fixture 114 includes a free cell 170 used to organize and/or hold the wires 102 during the sorting process. For example, the wires 102 may be initially separated and stored in the free cell 170, which holds the wires 102 away from the cradles and out of the way of the operator. The wires 102 may be taken out of the free cell 170, such as one at a time, and placed in the proper cradle 142 without all of the other wires 102 obstructing the loading of the selected wire 102 into the corresponding cradle 142. The free cell 170 may include one or more arms 172 that define a space configured to hold the wires 102. Optionally, the free cell 170 may extend from the cable support 130, away from the top plate 150. Alternatively, the free cell 170 may extend from the wire support 140 and the top plate 150 may include a window that receives the arms 172 as the top plate is lowered into position over the wire support 140. Optionally, the wire sorting fixture 114 may include multiple free cells 170, such as one free cell on one side (e.g. left side) of the cable 106 and another free cell on the opposite side (e.g. right side) of the cable 106. Wires 102 that ultimately are loaded into cradles 142 on the one side of the cable 106 may be loaded into the first free cell 170 while the wires that ultimately are loaded into cradles 142 on the other side of the cable 106 may be loaded into the second free cell 170.

Figure 2:
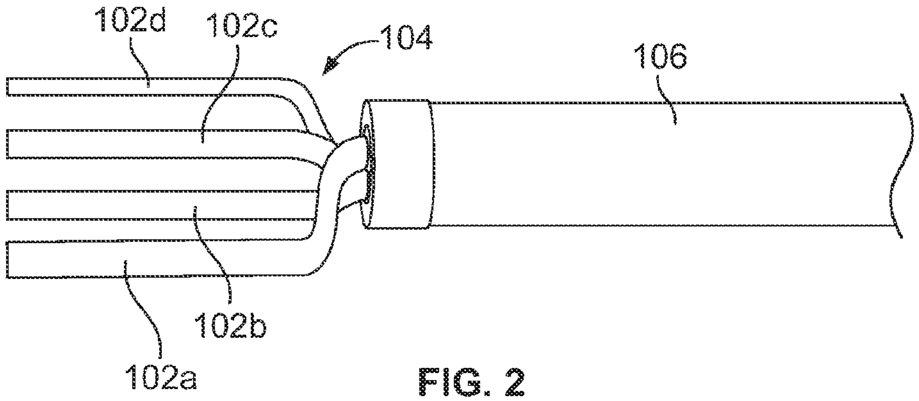
FIG. 2 illustrates an end of a cable showing a wire bundle.

FIG. 2 illustrates an end of the cable 106 showing the wire bundle 104. The cable 106 includes a plurality of the wires 102. Any number of wires 102 may be provided depending on the particular cable type. Any types of wires 102 may be provided, such as signal wires, ground wires, power wires and the like. The wires 102 may be different from one another, such as having different characteristics, such as different diameters, different colors, and the like.

In the illustrated embodiment, the multi-wire cable 106 includes four wires 102, including a power wire 102*a*, two signal wires 102*b*, 102*c* and a ground wire 102*d*. The cable 106 may be used as a cable for a micro-USB connector. The wires 102 are required to be in predetermined positions for termination to the circuit board and/or pins of the micro-USB connector. The wires 102 need to be straightened, flattened and/or aligned in a plane, and positioned in a certain layout, such as power-signal-signal-ground, for termination. The wire sorting fixture 114 (shown in FIG. 1) is used to organize the wires 102 for termination. Optionally, the wires 102 may be aligned on two or more planes.

Figure 3:
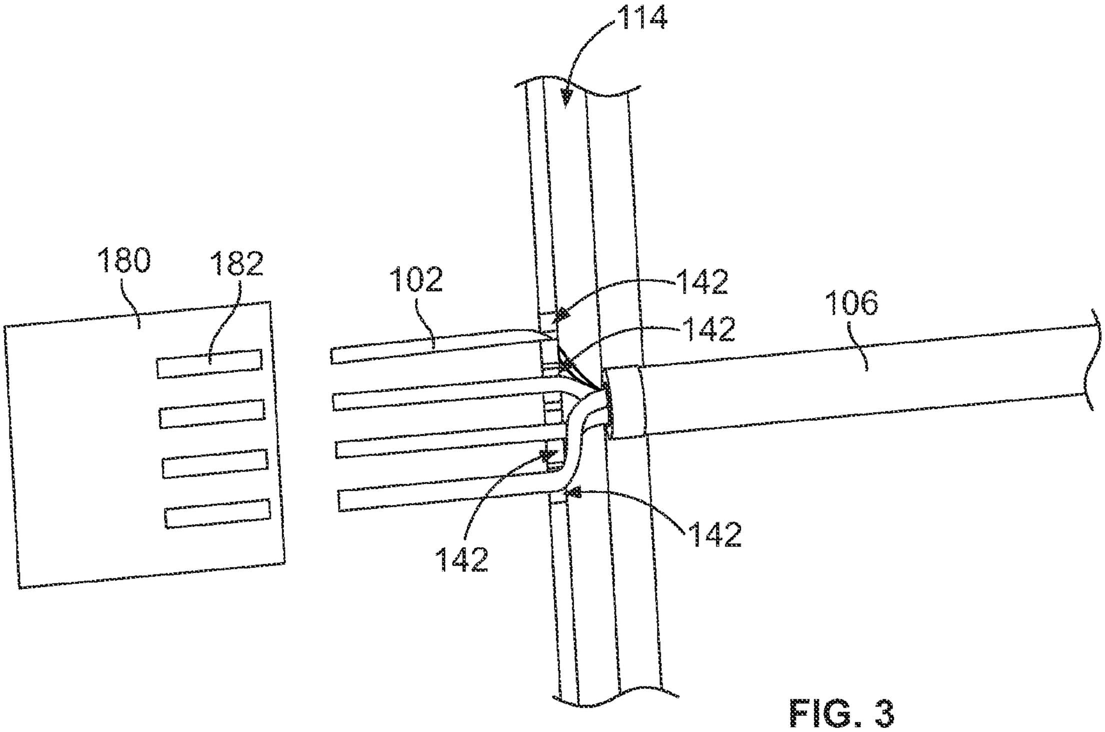
FIG. 3 illustrates the cable and the wires held by the wire sorting fixture and positioned for termination to a circuit board.

FIG. 3 illustrates the cable 106 and the wires 102 held by the wire sorting fixture 114 and positioned for termination to a circuit board 180. The wires 102 may be oriented at predetermined positions relative to each other and held in place by the wire sorting fixture 114. For example, the wires 102 may be aligned in a single row and spaced apart from each other for terminating to the circuit board 180. The circuit board 180 may have pads 182 at predetermine pitches. The wires 102 may be spaced apart to correspond to the spacing of the pads 182. The wires 102 may be soldered to the pads 182. Optionally, the wires 102 may be arranged to connect to both the top and the bottom of the circuit board 180.

The wires 102 may be oriented differently in other applications. For example, the wires 102 may be positioned for termination to individual terminals. For example, the wires 102 may be positioned for setting into crimp barrels of individual terminals. The spacing of the wires 102 may be controlled based on the spacing of the terminals along a carrier strip. The wire sorting fixture 114 controls the positioning of the wires 102 relative to each other depending on the particular application or end use for the cable 106.

Figure 4:
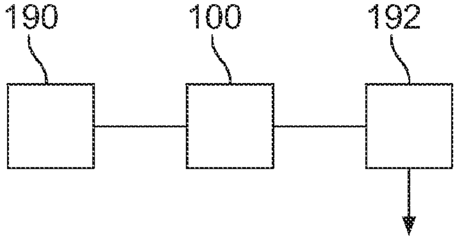
FIG. 4 illustrates a manufacturing process for manufacturing an electrical component using the wire sorting machine.

FIG. 4 illustrates a manufacturing process for manufacturing an electrical component using the wire sorting machine 100. The process uses a cable preparation machine 190, the wire sorting machine 100 and a connector processing machine 192. At the cable preparation machine 190, the cable 106 (shown in FIG. 1) may be prepared, such as by cutting the cable to length and removing a portion of the jacket 108 (shown in FIG. 1) to expose the wire bundle 104 (shown in FIG. 1).

The prepared cables are then transferred to the wires sorting machine 100. The wire sorting machine 100 separates the individual wires 102 (shown in FIG. 1) from the wire bundle 104 and positions the wires 102 at predetermine locations or positions relative to each other. The wire sorting fixture 114 (shown in FIG. 1) holds the relative positions of the wires 102 for further processing.

The wire sorting fixture 114, with the cable 106 and wires 102, is then transferred to the connector processing machine 192. The wires 102 may be stripped, cut, coated or subjected to other processes at the connector processing machine 192. At the connector processing machine 192, the cable 106 is terminated to an electrical connector to form the electrical component. For example, the wires 102 of the cable 106 may be soldered to a circuit board. The wires 102 of the cable 106 may be terminated to individual contacts or terminals. The wires 102 may be terminated to other components in alternative embodiments. For example, the wires 102 may be terminated to leads of a lead frame.

Figure 5:
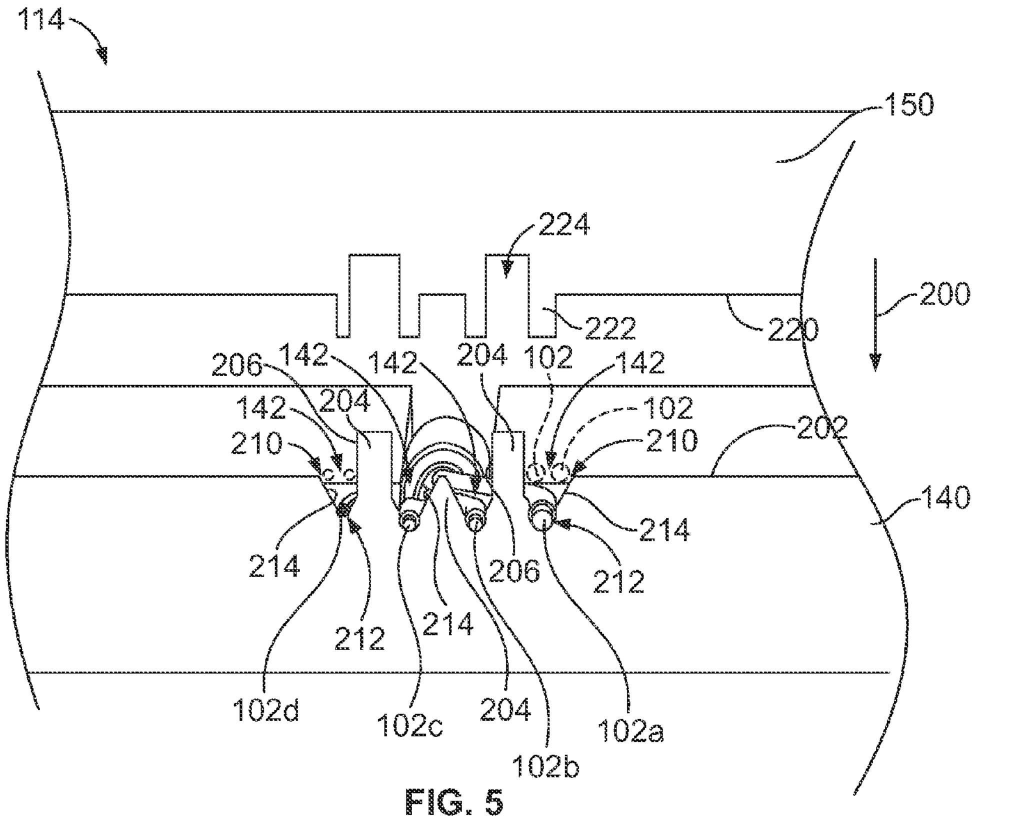
FIG. 5 is a front view of the wire sorting fixture showing a top plate in an open position.
Figure 6:
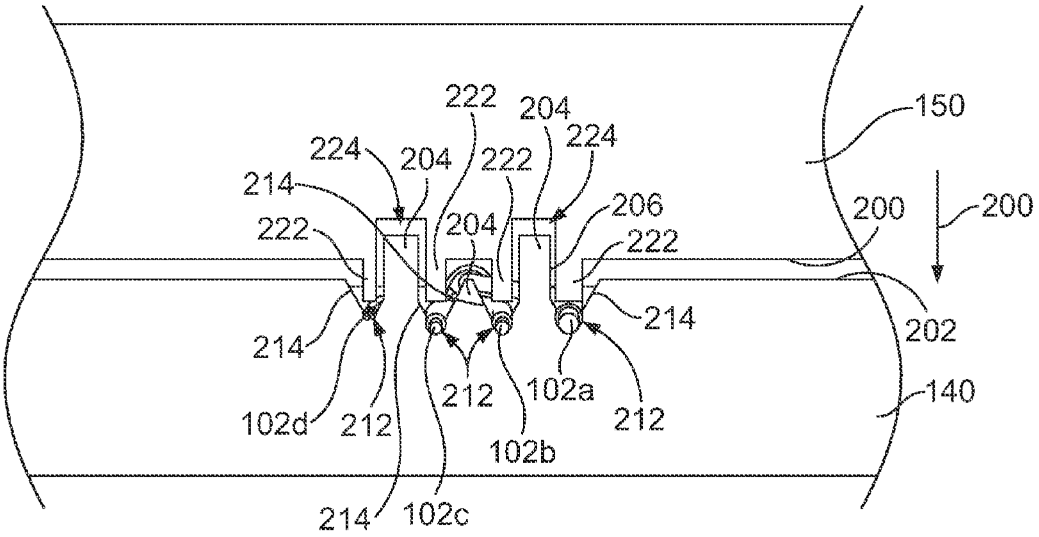
FIG. 6 is a front view of the wire sorting fixture showing the top plate in a closed or clamping position.

FIG. 5 is a front view of the wire sorting fixture 114, showing the top plate 150 in an open position. FIG. 6 is a front view of the wire sorting fixture 114 showing the top plate 150 in a closed or clamping position. The top plate 150 is configured to be moved towards the wire support 140 in a clamping direction 200. In the illustrated embodiment, the clamping direction 200 is a vertically downward direction. The top plate 150 is closed to the clamping position after each of the wires 102 are positioned in the corresponding cradles 142. In an exemplary embodiment, the wires 102 are coarsely positioned in the cradles 142 by the wire gripper 116 (shown in FIG. 1), or by hand. The wires 102 are finely positioned in the corresponding cradles 142 by the top plate 150. Optionally, a bottom plate similar to the top plate 150 may be used in addition to the top plate 150.

The wire support 140 includes an upward facing top surface 202. The cradles 142 are formed in the top surface 202 and provide spaces within the wire support 140 to support the wires 102. The cradles 142 are spaced apart at predetermined locations for supporting wires 102 in such predetermined locations.

The cradles 142 may have uniform spacing therebetween, or alternatively may have non uniform spacing therebetween. The cradles 142 are separated by separating walls 204 of the wire support 140. The separating walls 204 may extend upward from the top surface 202. Alternatively, the tops of the separating walls 204 may be defined by the top surface 202 or may be recessed below the top surface 202.

In the illustrated embodiment, the wire support 140 includes separating walls 204 of different heights. For example, the outer separating walls 204*a*, 204*b*, which are the separating walls 204 interior of the outermost cradles 142, are taller than the inner separating wall 204*c*. The outer separating walls 204*a*, 204*b* define towering separating walls as the outer separating walls 204*a*, 204*b* extend above the top surface 202. The towering separating walls 204 make it more difficult for the wires 102*a*, 102*d* in the outer cradles 142 to return back toward the center where the wires 102 exit the cable 106 (toward the cable axis 134). Manipulating the wires 102*a*, 102*d* to the outer cradles 142 causes stress on the wires 102, which cause the wires 102*a*, 102*d* to tend to return toward the cable axis 134. The towering separating walls 204 block the wires 102, making it difficult for the wires 102 to come out of the corresponding cradles 142. Having a shorter separating wall between the inner cradles 142 makes it easier for the wire gripper 116 (shown in FIG. 1) to manipulate the wires 102*b*, 102*c* into the corresponding cradles 142. The separating walls 204 have sides 206 that direct the wires 102 into the corresponding cradles 142. For examples, once the wire 102 is generally positioned above the corresponding cradle 142 and released, the wire 102 may fall into the cradle 142 or may be guided into the cradle 142 by the sides 206 of the separating wall 204. The sides 206 may be shaped and spaced to create an interference with the wire 102 to retain the wire 102 in the cradle 142.

In the illustrated embodiment, the cradles 142, are V-shaped having wide openings 210 at the top surface 202 and having narrow bases 212 at the bottoms of the cradles 142. The wide openings 210 make it possible to catch the coarsely positioned wires 102 in the cradles 142. The narrow bases 212 force the wires 102 into a certain position, such as being centered within the cradle 142. In an exemplary embodiment, the cradles 142 have slanted guide walls 214 extending between the openings 210 and the bases 212. The slanted guide walls 214 force the wires 102 into a predetermined location. For example, as the top plate 150 is closed, the top plate 150 engages the wires 102 and forces the wires 102 along the corresponding guide walls 214 to the bases 212. At the bases 212, the wires 102 are laterally fixed and are not able to move side-to-side. However, the openings 210 are wide enough to catch and receive the wires 102 from various lateral positions. For example, the wire 102 may be placed in the cradle 142 at a number of different lateral positions (e.g. coarsely positioned), and once the wire 102 is in the cradle 142 the guide walls 214 force the wire 102 to a predetermined lateral position (e.g. finely positioned).

The top plate 150 includes a bottom surface 220 facing the top surface 202 of the wire support 140. The top plate 150 includes fingers 222 extending downward from the bottom surface 220. The fingers 222 are received in corresponding cradles 142 to engage the corresponding wires 102 to press the wires 102 downward into the cradles 142 along the guide walls 214 as the top plate 150 is lowered to the clamping position. The fingers 222 are wide enough to be sure that the fingers 222 engage the wires 102 from any lateral position at which the wire 102 may be located within the openings 210. The fingers 222 are narrow enough that the fingers 222 do not bottom out against the guide walls 214 as the top plate 150 is closed to the clamping position. In an exemplary embodiment, the fingers 222 may be shaped to avoid damaging the wires 102. For example, the fingers 222 may be rounded or chamfered so that the fingers 222 do not cut through the wires 102.

In the clamping position, the wires 102 may be fixed between the fingers 222 and the bases 212 such that the wires 102 are restricted from moving side-to-side and are restricted from moving up and down. Holding the wires 102 at predetermined positions, allows further processing of the wires 102 by other machines or processes. For example, the ends of the wires 102 may be stripped, coated, cut, soldered, crimped or subjected to other processes.

In an exemplary embodiment, the top plate 150 includes cavities 224 formed therein open at the bottom surface 220 of the top plate 150. As the top plate 150 is closed to the clamping position, the separating walls 204 may extend into the corresponding cavities 224. In an exemplary embodiment, the cavities 224 are provided only for the towering separating walls 204. When the top plate 150 is in the clamping position, the separating walls 204 extend into the top plate 150 above the bottom surface 220.

Figure 7:
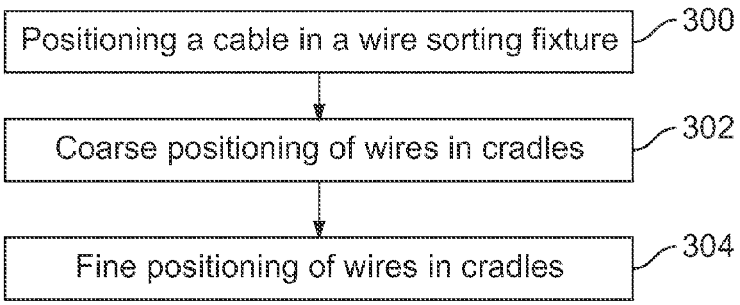
FIG. 7 illustrates a method of sorting wires.

FIG. 7 illustrates a method of sorting wires from a wire bundle. The method may be performed by an automated process without the need for human intervention. The method includes positioning 300 a multi-wire cable in a wire sorting fixture. The wire sorting fixture may have a cable support for supporting the cable and the wire support for supporting the individual wires of the cable. The wire support has individual cradles configured to receive different wires of the cable.

The method includes coarse positioning 302 of the wires in cradles by generally aligning the wires with openings of the cradles. The openings may be significantly wider than the wires to allow coarse positioning therein. Coarse positioning of the wires includes placing the wires on a desired side of a corresponding separating wall between the cradles. The separating walls may guide the wire into the cradle. Coarse positioning does not required exact horizontal positioning or vertical positioning of the wires, but rather only requires general alignment of the wires with the cradles 142.

The method includes fine positioning 304 of the wires in the cradles. The wires may be finely positioned by pressing downward on the wires using the top plate. The cradles may guide the wires into predetermined locations, such as by using slanted guide walls that extend from the wide opening of the cradles to a narrow base of the cradle. Pressing downward on the wires using the top plate forces the wires against the slanted guide walls to control the lateral position of the wire within a cradle. Optionally, fine positioning of the wires may center the wires laterally within the cradles, such as between two slanted guide walls that are slanted in opposite directions. The top plate may include fingers that extend downward from the top plate. The fingers may extend into the cradles to press on the wires. When the wires are finely positioned, the wires may be captured between the top plate and the bases of the cradles.

The method may include processing the wires while the wires are held within the cradles. For example, once the wires are fixed in position, the wires may be stripped, trimmed, coated and the like. Once the wires are prepped for termination, the wires may be terminated, such as by soldering the wires to the circuit board or crimping terminals to the wires.

Figure 8:
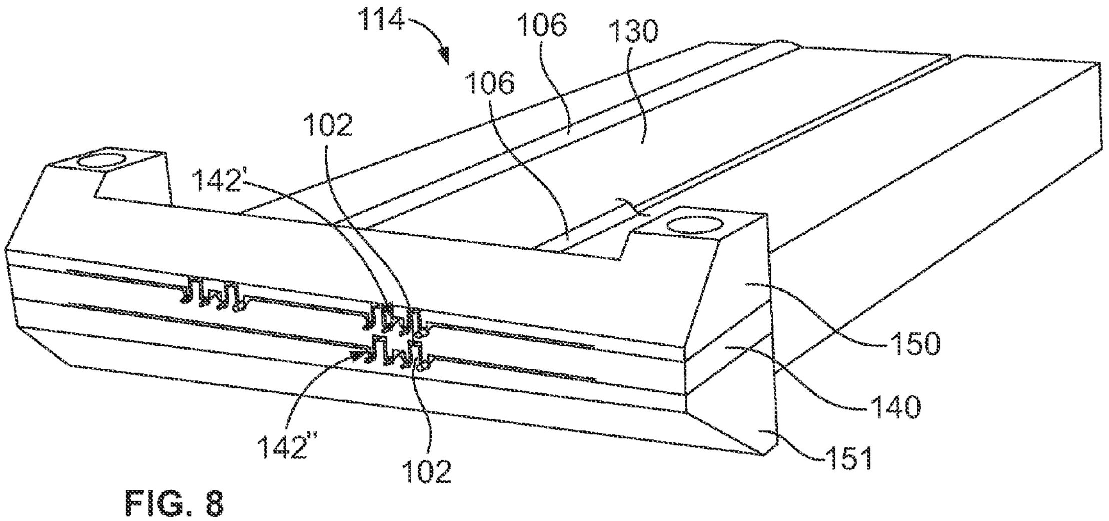
FIG. 8 illustrates the wire sorting fixture.

FIG. 8 illustrates the wire sorting fixture 114 showing the cable 106 positioned in the cable support 130. In the illustrated embodiment, the wire sorting fixture 114 is adapted to receive multiple cables 106. For example, the wire support 140 includes multiple sets of cradles 142. Additionally, the wire support 140 includes upper cradles 142' and lower cradles 142". The top plate 150 is shown clamping the wires 102 in the upper cradles 142'. A bottom plate 151 is shown clamping the wires 102 in the lower cradles 142".

Figure 9:
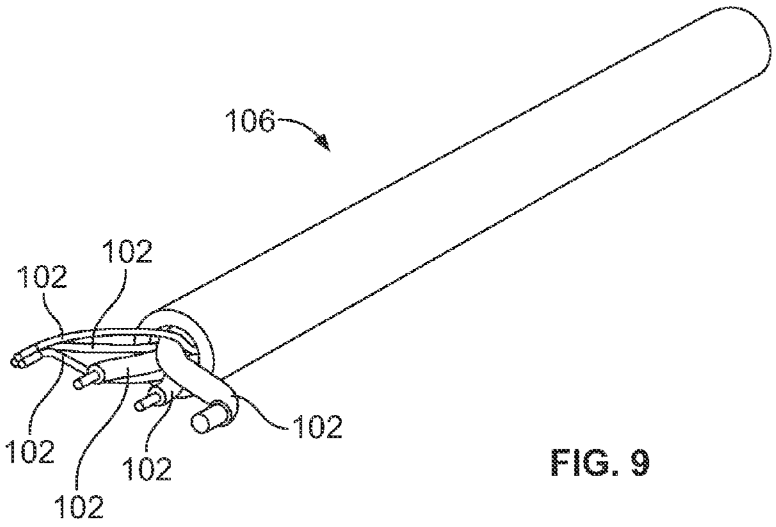
FIG. 9 illustrates the cable.

FIG. 9 illustrates an exemplary embodiment of the cable 106. Optionally, multiple wires 102, such as ground wires, may be grouped together for loading into the same cradle 142 (shown in FIG. 10).

Figure 10:
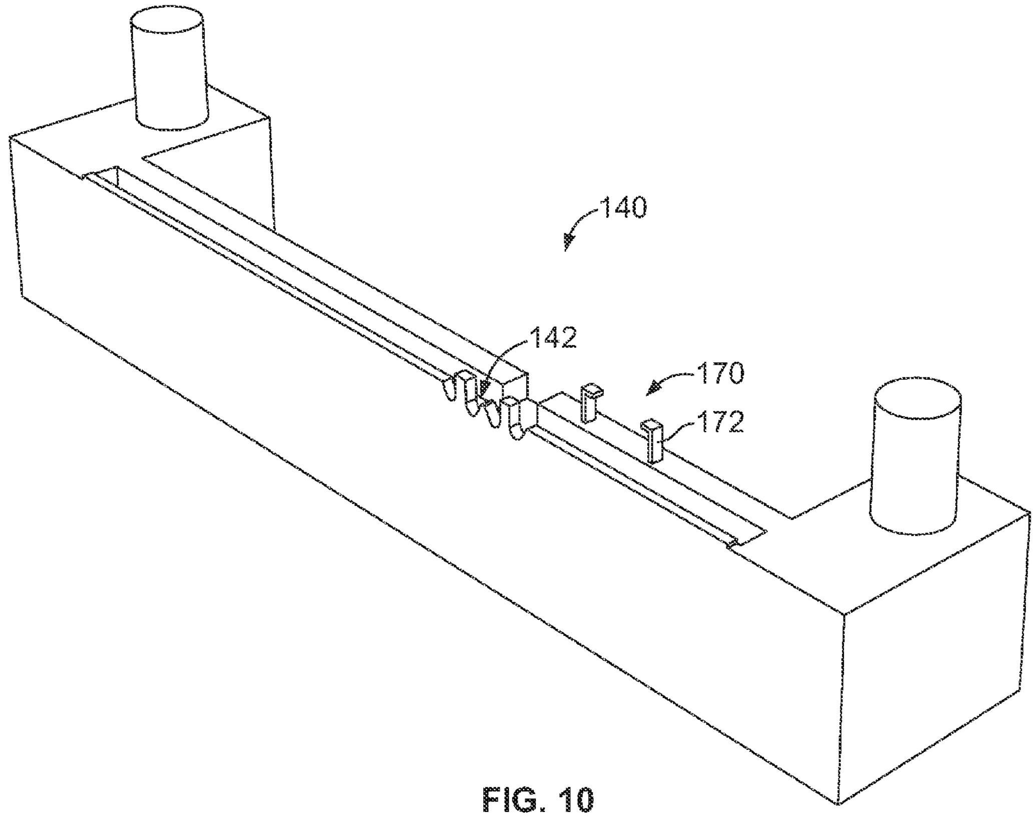
FIG. 10 illustrates the wire support.
Figure 11:
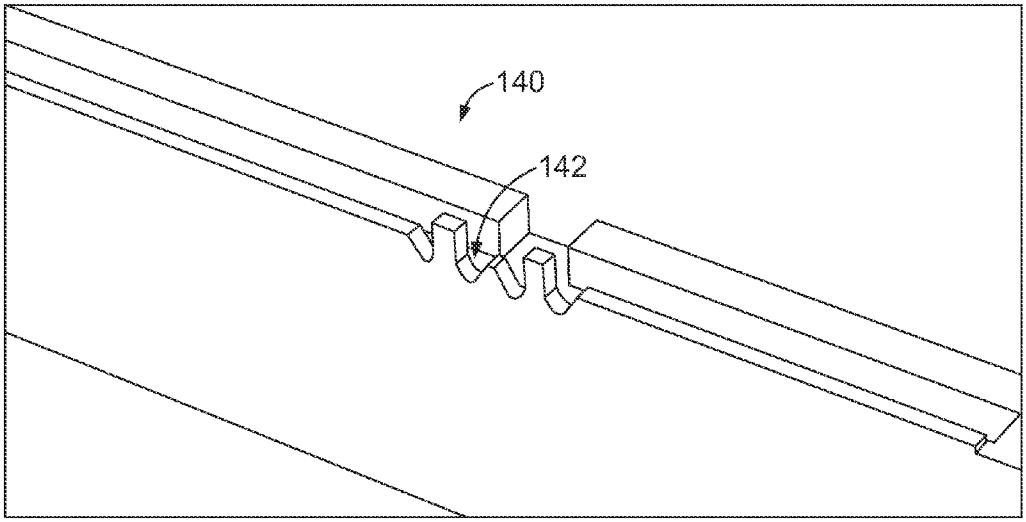
FIG. 11 illustrates a portion of the wire support.

FIG. 10 illustrates the wire support 140 showing the cradles 142. FIG. 11 is an enlarged view of a portion of the wire support 140 shown in FIG. 10, showing the cradles 142. The embodiment shown in FIG. 10 only includes the cradles 142 along the top of the wire support 140. The wire support 140 includes posts for guiding the top plate (shown in FIG. 12) into position on the wire support 140. FIG. 10 illustrates the free cell 170 with the arms 172 extending from the wire support 140.

Figure 12:
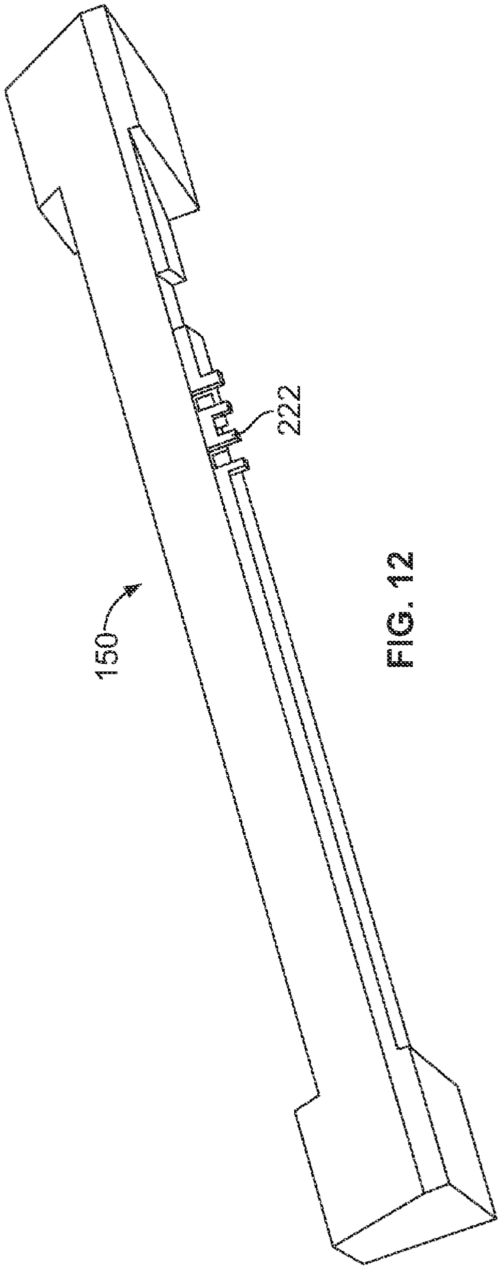
FIG. 12 illustrates the top plate.
Figure 13:
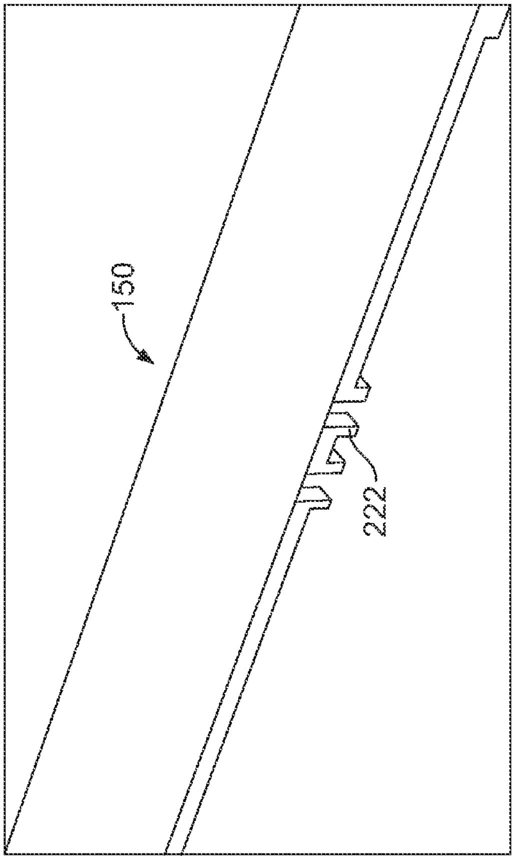
FIG. 13 illustrates a portion of the top plate.

FIG. 12 illustrates the top plate 150 showing the fingers 222. FIG. 13 illustrates a portion of the top plate 150. The top plate 150 includes a window 174 configured to receive the arms 172 (shown in FIG. 10) when the top plate 150 is coupled to the wire support 140 (shown in FIG. 10).

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms “including” and “in which” are used as the plain-English equivalents of the respective terms “comprising” and “wherein.” Moreover, in the following claims, the terms “first,” “second,” and “third,” etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase “means for” followed by a statement of function void of further structure.

What is claimed is:

1. A wire sorting fixture comprising: a cable support configured to repeatedly support multi-wire cables; a wire support configured to temporarily support wires of a corresponding multi-wire cable for processing, the wire support having a top surface, the wire support having a plurality of V-shaped cradles open at the top surface wherein each V-shaped cradle of the plurality of V-shaped cradles is configured to receive a single wire therein, the wire support having separating walls between corresponding V-shaped cradles, wherein the plurality of V-shaped cradles are tapered inward having wide openings at the top surface to catch coarsely positioned wires and having narrow bases to finely position the wires within the V-shaped cradles, the wires being variably positionable laterally within the wide openings, the wires being laterally fixed at the narrow bases, the separating walls spacing the narrow bases of the cradles apart such that the wires are held at spaced apart positions for processing; wherein the separating walls include outer separating walls and at least one inner separating wall, the outer separating walls being positioned between outermost V-shaped cradles of the plurality of V-shaped cradles, the outer separating walls being taller than the at least one inner separating wall and a top plate above the wire support, the top plate being moved toward the wire support to a clamping position and moving the wires in the V-shaped cradles to the narrow bases as the top plate is moved to the clamping position after the wires are positioned in the corresponding V-shaped cradles and movable away from the wire support after wire processing to a released position, wherein the top plate holds the wires in a non-damaging manner between the top plate and the wire support in the clamping position and wherein the top plate allows release of the wires from the wire support after the top plate is moved to the released position to allow reception of another one of the multi-wire cables in the cable support and the wire support.

2. The wire sorting fixture of claim 1, wherein the two outer separating walls extend vertically above the top surface.

3. The wire sorting fixture of claim 1, wherein the plurality of V-shaped cradles are aligned in a row and spaced apart by the separating walls, the wire support having a clearance forward of the wire support for processing the ends of the wires forward of the wire support.

4. The wire sorting fixture of claim 1, wherein the top plate includes fingers extending downward from a bottom surface of the top plate, the fingers being received in the corresponding V-shaped cradles to engage the corresponding wires to press the wires downward into the plurality of V-shaped cradles as the top plate is lowered to the clamping position.

5. The wire sorting fixture of claim 1, wherein the top plate includes cavities formed therein open at a bottom surface of the top plate, the separating walls extending into the cavities as the top plate is lowered to the clamping position.

6. A wire sorting machine comprising: a wire gripper configured to grip individual wires of multi-wire cables to independently move corresponding wires to predetermined positions in a wire sorting area; and a wire sorting fixture for temporarily holding the wires of a corresponding multi-wire cable, wherein the multi-wire cables are sequentially and repeatedly presented to the wire sorting fixture for support, sorting by the wire gripper, processing the wires and then release of the corresponding multi-wire cable for processing of a next multi-wire cable, the wire sorting fixture comprising: a cable support configured to temporarily support the corresponding multi-wire cable; a wire support configured to temporarily support the wires of the corresponding multi-wire cable for processing, the wire support having a top surface, the wire support having a plurality of V-shaped cradles open at the top surface wherein each V-shaped cradle of the plurality of V-shaped cradles is configured to receive a single wire therein, the wire support having separating walls between corresponding V-shaped cradles, wherein the plurality of V-shaped cradles are tapered inward having wide openings at the top surface to catch coarsely positioned wires and having narrow bases to finely position the wires within the plurality of V-shaped cradles, the wires being variably positionable laterally within the wide openings, the wires being laterally fixed at the narrow bases, the separating walls spacing the narrow bases of the plurality of V-shaped cradles apart such that the wires are held at spaced apart positions for processing, wherein the separating walls include outer separating walls and at least one inner separating wall, the outer separating walls being positioned between outermost V-shaped cradles of the plurality of V-shaped cradles, the outer separating walls being taller than the at least one inner separating wall; wherein the wire gripper is configured to move the wires into the corresponding V-shaped cradles; and a top plate above the wire support, the top plate being moved toward the wire support to a clamping position and moving the wires in the plurality of V-shaped cradles to the base as the top plate is moved to the clamping position after the wires are positioned in the corresponding V-shaped cradles and movable away from the wire support after wire processing to a released position, wherein the top plate holds the wires in a non-damaging manner between the top plate and the wire support in the clamping position and wherein the top plate allows release of the wires from the wire support after the top plate is moved to the released position to allow reception of the next multi-wire cable in the cable support and the wire support.

7. The wire sorting machine of claim 6, further comprising a sensor module configured to identify the wires in the wire sorting area, operation of the wire gripper being controlled based on input from the sensor module.

8. The wire sorting machine of claim 6, wherein the top plate includes fingers extending downward from a bottom surface of the top plate, the fingers being received in the corresponding V-shaped cradles to engage the corresponding wires to press the wires downward into the plurality of V-shaped cradles as the top plate is lowered to the clamping position.

9. The wire sorting machine of claim 6, wherein the top plate includes cavities formed therein open at a bottom surface of the top plate, the separating walls extending into the cavities as the top plate is lowered to the clamping position.

* * * * *